United States Patent
Hembree et al.

(10) Patent No.: US 7,547,978 B2
(45) Date of Patent: Jun. 16, 2009

(54) UNDERFILL AND ENCAPSULATION OF SEMICONDUCTOR ASSEMBLIES WITH MATERIALS HAVING DIFFERING PROPERTIES

(75) Inventors: David R. Hembree, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 55 days.

(21) Appl. No.: 10/867,257

(22) Filed: Jun. 14, 2004

(65) Prior Publication Data

US 2005/0277231 A1 Dec. 15, 2005

(51) Int. Cl.
*H01L 23/29* (2006.01)
*H01L 23/02* (2006.01)
*H01L 23/34* (2006.01)
*H01L 23/58* (2006.01)
*H01L 23/28* (2006.01)

(52) U.S. Cl. .............. 257/788; 257/685; 257/724; 257/725; 257/789; 257/795; 257/643; 257/787

(58) Field of Classification Search ............. 257/685, 257/724–725, 787–789, 795, 643
See application file for complete search history.

(56) References Cited

U.S. PATENT DOCUMENTS

| | | | |
|---|---|---|---|
| 3,976,288 A | 8/1976 | Cuomo, Jr. |
| 4,463,073 A | 7/1984 | Miyauchi et al. |
| 4,575,330 A | 3/1986 | Hull |
| 4,925,515 A | 5/1990 | Yoshimura et al. |
| 4,929,402 A | 5/1990 | Hull |
| 4,996,010 A | 2/1991 | Modrek |
| 4,999,143 A | 3/1991 | Hull et al. |
| 5,015,424 A | 5/1991 | Smalley |
| 5,058,988 A | 10/1991 | Spence |
| 5,059,021 A | 10/1991 | Spence et al. |
| 5,059,359 A | 10/1991 | Hull et al. |

(Continued)

FOREIGN PATENT DOCUMENTS

JP 2006-041183 9/2006

(Continued)

OTHER PUBLICATIONS

Accelerated Technologies First to Offer New Composite Stereolithography Material, www.acceleratedtechnologies.com.

(Continued)

*Primary Examiner*—Ida M Soward
(74) *Attorney, Agent, or Firm*—TraskBritt

(57) ABSTRACT

Polymerized materials for forming the underfill and encapsulation structures for semiconductor package are disclosed. A filler constituent, such as boron nitride, silicates, elemental metals, or alloys, may be added to a liquid photopolymer resin to tailor the physical properties thereof upon curing. The filler constituents may be employed to alter the coefficient of thermal expansion, thermal conductivity, or electrical conductivity of the polymerized material. A number of different embodiments are disclosed that employ the above materials in selected regions of the underfill and encapsulation structures of the semiconductor package. The polymerized materials may also be used to form support structures and covers for optically interactive semiconductor devices. Methods for forming the above structures using stereolithography are also disclosed.

25 Claims, 9 Drawing Sheets

U.S. PATENT DOCUMENTS

| | | | |
|---|---|---|---|
| 5,076,974 A | 12/1991 | Modrek et al. | |
| 5,087,964 A * | 2/1992 | Hatta | 257/680 |
| 5,096,530 A | 3/1992 | Cohen | |
| 5,104,592 A | 4/1992 | Hull et al. | |
| 5,123,734 A | 6/1992 | Spence et al. | |
| 5,130,064 A | 7/1992 | Smalley et al. | |
| 5,133,987 A | 7/1992 | Spence et al. | |
| 5,141,680 A | 8/1992 | Almquist et al. | |
| 5,143,663 A | 9/1992 | Leyden et al. | |
| 5,164,128 A | 11/1992 | Modrek | |
| 5,173,220 A | 12/1992 | Reiff et al. | |
| 5,174,931 A | 12/1992 | Almquist et al. | |
| 5,174,943 A | 12/1992 | Hull | |
| 5,182,055 A | 1/1993 | Allison et al. | |
| 5,182,056 A | 1/1993 | Spence et al. | |
| 5,182,715 A | 1/1993 | Vorgitch et al. | |
| 5,184,307 A | 2/1993 | Hull et al. | |
| 5,192,469 A | 3/1993 | Smalley et al. | |
| 5,192,559 A | 3/1993 | Hull et al. | |
| 5,209,878 A | 5/1993 | Smalley et al. | |
| 5,234,636 A | 8/1993 | Hull et al. | |
| 5,236,637 A | 8/1993 | Hull | |
| 5,238,639 A | 8/1993 | Vinson et al. | |
| 5,248,456 A | 9/1993 | Evans, Jr. et al. | |
| 5,256,340 A | 10/1993 | Allison et al. | |
| 5,258,146 A | 11/1993 | Almquist et al. | |
| 5,264,061 A | 11/1993 | Juskey et al. | |
| 5,267,013 A | 11/1993 | Spence | |
| 5,273,691 A | 12/1993 | Hull et al. | |
| 5,321,622 A | 6/1994 | Snead et al. | |
| 5,344,298 A | 9/1994 | Hull | |
| 5,345,391 A | 9/1994 | Hull et al. | |
| 5,358,673 A | 10/1994 | Heller et al. | |
| 5,378,508 A | 1/1995 | Castro et al. | |
| 5,439,622 A | 8/1995 | Pennisi et al. | |
| 5,447,822 A | 9/1995 | Hull et al. | |
| 5,460,703 A | 10/1995 | Nulman et al. | |
| 5,481,470 A | 1/1996 | Snead et al. | |
| 5,495,328 A | 2/1996 | Spence et al. | |
| 5,501,824 A | 3/1996 | Almquist et al. | |
| 5,547,906 A | 8/1996 | Badehi | |
| 5,554,336 A | 9/1996 | Hull | |
| 5,555,476 A | 9/1996 | Suzuki et al. | |
| 5,556,590 A | 9/1996 | Hull | |
| 5,569,349 A | 10/1996 | Almquist et al. | |
| 5,569,431 A | 10/1996 | Hull | |
| 5,571,471 A | 11/1996 | Hull | |
| 5,573,722 A | 11/1996 | Hull | |
| 5,600,181 A * | 2/1997 | Scott et al. | 257/723 |
| 5,609,812 A | 3/1997 | Childers et al. | |
| 5,609,813 A | 3/1997 | Allison et al. | |
| 5,610,824 A | 3/1997 | Vinson et al. | |
| 5,622,634 A | 4/1997 | Noma et al. | |
| 5,630,981 A | 5/1997 | Hull | |
| 5,637,169 A | 6/1997 | Hull et al. | |
| 5,651,934 A | 7/1997 | Almquist et al. | |
| 5,659,478 A | 8/1997 | Pennisi et al. | |
| 5,667,820 A | 9/1997 | Heller et al. | |
| 5,672,312 A | 9/1997 | Almquist et al. | |
| 5,675,402 A | 10/1997 | Cho et al. | |
| 5,676,904 A | 10/1997 | Almquist et al. | |
| 5,688,464 A | 11/1997 | Jacobs et al. | |
| 5,693,144 A | 12/1997 | Jacobs et al. | |
| 5,695,707 A | 12/1997 | Almquist et al. | |
| 5,705,016 A | 1/1998 | Senoo et al. | |
| 5,711,911 A | 1/1998 | Hull | |
| 5,776,409 A | 7/1998 | Almquist et al. | |
| 5,779,967 A | 7/1998 | Hull | |
| 5,814,265 A | 9/1998 | Hull | |
| 5,818,005 A | 10/1998 | Pratt et al. | |
| 5,827,394 A | 10/1998 | Lu | |
| 5,833,869 A | 11/1998 | Haas et al. | |
| 5,854,748 A | 12/1998 | Snead et al. | |
| 5,855,718 A | 1/1999 | Nguyen et al. | |
| 5,855,836 A | 1/1999 | Leyden et al. | |
| 5,869,354 A | 2/1999 | Leedy | |
| 5,885,511 A | 3/1999 | Heller et al. | |
| 5,897,825 A | 4/1999 | Fruth et al. | |
| 5,902,537 A | 5/1999 | Almquist et al. | |
| 5,902,538 A | 5/1999 | Kruger et al. | |
| 5,904,889 A | 5/1999 | Serbin et al. | |
| 5,933,190 A | 8/1999 | Dierickx et al. | |
| 5,937,265 A | 8/1999 | Pratt et al. | |
| 5,943,235 A | 8/1999 | Earl et al. | |
| 5,945,058 A | 8/1999 | Manners et al. | |
| 5,953,590 A | 9/1999 | Piper et al. | |
| 5,969,424 A | 10/1999 | Matsuki et al. | |
| 5,985,523 A | 11/1999 | Patton | |
| 5,998,867 A * | 12/1999 | Jensen et al. | 257/729 |
| 6,039,830 A | 3/2000 | Park et al. | |
| 6,048,948 A | 4/2000 | Tochioka | |
| 6,099,783 A | 8/2000 | Scranton et al. | |
| 6,140,151 A | 10/2000 | Akram | |
| 6,150,240 A | 11/2000 | Lee et al. | |
| 6,245,646 B1 | 6/2001 | Roberts | |
| 6,251,488 B1 | 6/2001 | Miller et al. | |
| 6,259,962 B1 | 7/2001 | Gothait | |
| 6,266,874 B1 | 7/2001 | DiStefano et al. | |
| 6,268,584 B1 | 7/2001 | Keicher et al. | |
| 6,283,997 B1 | 9/2001 | Garg et al. | |
| 6,284,072 B1 | 9/2001 | Ryan et al. | |
| 6,297,138 B1 | 10/2001 | Rimai et al. | |
| 6,303,469 B1 | 10/2001 | Larson et al. | |
| 6,307,243 B1 | 10/2001 | Rhodes | |
| 6,322,598 B1 | 11/2001 | Meuris et al. | |
| 6,323,295 B1 | 11/2001 | Muhlebach et al. | |
| 6,323,436 B1 * | 11/2001 | Hedrick et al. | 174/256 |
| 6,326,698 B1 | 12/2001 | Akram | |
| 6,337,122 B1 | 1/2002 | Grigg et al. | |
| 6,344,402 B1 | 2/2002 | Sekiya | |
| 6,353,257 B1 * | 3/2002 | Huang | 257/704 |
| 6,391,251 B1 | 5/2002 | Keicher et al. | |
| 6,399,464 B1 | 6/2002 | Muntifering et al. | |
| 6,403,168 B2 | 6/2002 | Meyer et al. | |
| 6,407,334 B1 * | 6/2002 | Jimarez et al. | 174/557 |
| 6,417,022 B1 | 7/2002 | Hsiao et al. | |
| 6,432,752 B1 | 8/2002 | Farnworth | |
| 6,465,329 B1 | 10/2002 | Glenn | |
| 6,468,891 B2 | 10/2002 | Williams | |
| 6,471,806 B1 | 10/2002 | McKenna et al. | |
| 6,472,294 B2 | 10/2002 | Meuris et al. | |
| 6,482,576 B1 | 11/2002 | Farnworth et al. | |
| 6,483,719 B1 | 11/2002 | Bachman | |
| 6,498,074 B2 | 12/2002 | Siniaguine et al. | |
| 6,500,746 B2 | 12/2002 | Williams | |
| 6,509,636 B1 * | 1/2003 | Tsai et al. | 257/678 |
| 6,514,798 B2 | 2/2003 | Farnworth | |
| 6,518,662 B1 * | 2/2003 | Smith et al. | 257/724 |
| 6,521,844 B1 | 2/2003 | Fuerniss et al. | |
| 6,524,346 B1 | 2/2003 | Farnworth | |
| 6,524,881 B1 | 2/2003 | Tandy et al. | |
| 6,529,027 B1 | 3/2003 | Akram et al. | |
| 6,537,482 B1 | 3/2003 | Farnworth | |
| 6,544,465 B1 | 4/2003 | Farnworth et al. | |
| 6,544,821 B2 | 4/2003 | Akram | |
| 6,544,902 B1 | 4/2003 | Farnworth | |
| 6,549,821 B1 | 4/2003 | Farnworth et al. | |
| 6,551,906 B2 | 4/2003 | Oka | |
| 6,562,278 B1 | 5/2003 | Farnworth et al. | |
| 6,562,661 B2 | 5/2003 | Grigg | |
| 6,569,373 B2 | 5/2003 | Napadensky | |
| 6,569,709 B2 | 5/2003 | Derderian | |
| 6,569,753 B1 | 5/2003 | Akram et al. | |
| 6,582,983 B1 | 6/2003 | Runyon et al. | |

| | | |
|---|---|---|
| 6,585,927 B2 | 7/2003 | Grigg et al. |
| 6,593,171 B2 | 7/2003 | Farnworth |
| 6,607,689 B1 | 8/2003 | Farnworth |
| 6,611,053 B2 | 8/2003 | Akram |
| 6,632,732 B2 | 10/2003 | Williams |
| 6,644,763 B1 | 11/2003 | Gothait |
| 6,649,991 B1 | 11/2003 | Chen et al. |
| 6,658,314 B1 | 12/2003 | Gothait |
| 6,677,238 B2 | 1/2004 | Seki |
| 6,686,225 B2 | 2/2004 | Wachtler |
| 6,696,363 B2 | 2/2004 | Lee et al. |
| 6,696,752 B2 * | 2/2004 | Su et al. .................... 257/678 |
| 6,713,857 B1 * | 3/2004 | Tsai .......................... 257/686 |
| 6,734,032 B2 | 5/2004 | Tandy et al. |
| 6,740,962 B1 | 5/2004 | Grigg |
| 6,746,899 B2 | 6/2004 | Grigg |
| 6,762,502 B1 | 7/2004 | Akram |
| 6,764,933 B2 | 7/2004 | Williams |
| 6,764,935 B2 | 7/2004 | Williams |
| 6,767,815 B2 | 7/2004 | Williams |
| 6,780,744 B2 | 8/2004 | Williams |
| 6,833,627 B2 | 12/2004 | Farnworth |
| 6,849,915 B1 * | 2/2005 | Tsai .......................... 257/432 |
| 6,875,640 B1 | 4/2005 | Farnworth et al. |
| 6,885,107 B2 | 4/2005 | Kinsman |
| 6,893,904 B2 * | 5/2005 | Akram ....................... 438/127 |
| 6,897,096 B2 | 5/2005 | Cobbley et al. |
| 6,908,784 B1 * | 6/2005 | Farnworth et al. .......... 438/106 |
| 6,911,173 B2 | 6/2005 | Farnworth |
| 6,940,181 B2 | 9/2005 | Derderian et al. |
| 6,949,834 B2 * | 9/2005 | Connell et al. .............. 257/777 |
| 6,963,127 B2 | 11/2005 | Akram |
| 7,041,513 B2 * | 5/2006 | Akram ........................ 438/14 |
| 7,057,832 B2 | 6/2006 | Wu et al. |
| 7,071,084 B2 | 7/2006 | Yokoyama et al. |
| 7,084,474 B2 * | 8/2006 | Hung et al. ................. 257/434 |
| 7,087,984 B2 * | 8/2006 | Akram ....................... 257/669 |
| 7,112,471 B2 | 9/2006 | Boon et al. |
| 7,138,695 B2 * | 11/2006 | Kim et al. ................... 257/433 |
| 7,169,703 B2 | 1/2007 | Aomori |
| 7,215,015 B2 * | 5/2007 | Moden ....................... 257/680 |
| 7,221,051 B2 | 5/2007 | Ono et al. |
| 7,253,028 B2 | 8/2007 | Liu |
| 2001/0036718 A1 | 11/2001 | Williams |
| 2001/0051395 A1 | 12/2001 | Grigg |
| 2002/0016387 A1 | 2/2002 | Shen |
| 2002/0123213 A1 | 9/2002 | Williams |
| 2002/0159242 A1 * | 10/2002 | Nakatani et al. ............. 361/760 |
| 2002/0171177 A1 | 11/2002 | Kritchman et al. |
| 2002/0176793 A1 | 11/2002 | Moussa et al. |
| 2003/0043360 A1 | 3/2003 | Farnworth |
| 2003/0059708 A1 | 3/2003 | Yamamura et al. |
| 2003/0068840 A1 | 4/2003 | Grigg |
| 2003/0151167 A1 | 8/2003 | Kritchman et al. |
| 2003/0232461 A1 | 12/2003 | Bolken |
| 2004/0018709 A1 | 1/2004 | Williams |
| 2004/0165362 A1 | 8/2004 | Farnworth |
| 2004/0229002 A1 | 11/2004 | Davis et al. |
| 2005/0059188 A1 * | 3/2005 | Bolken et al. ............... 438/106 |
| 2005/0064681 A1 | 3/2005 | Wood et al. |
| 2005/0064683 A1 | 3/2005 | Farnworth |
| 2005/0082651 A1 | 4/2005 | Farnworth et al. |
| 2005/0218518 A1 * | 10/2005 | Jiang et al. .................. 257/738 |
| 2005/0231626 A1 | 10/2005 | Tuttle et al. |
| 2005/0277231 A1 | 12/2005 | Hembree et al. |
| 2006/0035415 A1 | 2/2006 | Wood et al. |
| 2006/0043599 A1 | 3/2006 | Akram et al. |
| 2006/0044433 A1 | 3/2006 | Akram |
| 2006/0261458 A1 * | 11/2006 | Paek et al. .................. 257/680 |

FOREIGN PATENT DOCUMENTS

WO      WO 8806494      9/1988

OTHER PUBLICATIONS

Circuit Board Protection—Potting, Encapsulation, Conformal Coating, & Gasketing Materials, pp. 29-32, www.loctite.com/electronics.
Miller, Doyle, "New Laser-Directed Deposition Technology," Microelectronic Fabrication, www.hdi-online.com, HDI, p. 16, Aug. 2001.
Miller, Doyle, et al., "Maskless Mesoscale Materials Deposition," Deposition Technology, www.hdi-online.com, HDI, pp. 20-22, Sep. 2001.
Objet FullCure™ 700 Series, Photopolymer Materials and Support Resins (2 pages), © 2003 Objet Geometries, Ltd. Objet™, etc.
Objet Prototyping the Future, How it Works (2 pages), 2003 by Objet Geometries Ltd. Ltd.
PNI/Plastics News International, Applied Machinery Pty Ltd, Buy & Sell Plastics Machinery, Jan. 10, 2004, www.plasticsnews.net.
Miller, Doyle, et al., "Maskless Mesoscale Materials Deposition," Deposition Technology, www.hdi-online.com, HDI, pp. 20-22, Sep. 2001.
Objet FullCure ™ 700 Series, Photopolymer Materials and Support Resins (2 pages), © 2003 Objet Geometries, Ltd. Objet™, etc.
Objet Prototyping the Future, How it Works (2 pages), 2003 by Objet Geometries Ltd. Ltd.
PNI/Plastics News International, Applied Machinery Pty Ltd, Buy & Sell Plastics Machinery, Jan. 10, 2004, www.plasticsnews.net.
Stereolithography Resin is Optically Clear, www.manufacturingtalk.com/news/dsm/dsm103.html, Aug. 3, 2001, pp. 1-2.
Oliver et al., Semicondcutor Constructions and Assemblies, Electronic Systems, and Methods of Forming Semiconductor Constructions and Assemblies, U.S. Appl. No. 11/483,002 filed Jul. 6, 2006.

* cited by examiner

UNDERFILL AND ENCAPSULATION OF SEMICONDUCTOR ASSEMBLIES WITH MATERIALS HAVING DIFFERING PROPERTIES

BACKGROUND OF THE INVENTION

1. Field of the Invention

The present invention relates to the underfilling and encapsulation of semiconductor devices on a carrier substrate. More specifically, the present invention relates to a method of fabricating a semiconductor assembly, wherein the underfill and encapsulation materials may exhibit differing material properties and are formed using stereolithography.

2. State of the Art

Flip-chip style packaging for semiconductor dice is becoming ever more popular. In a flip-chip package, an array or pattern of external conductive elements such as solder bumps, or conductive or conductor-filled epoxy pillars, protrude from the active surface of the semiconductor die for use in mechanically and electrically connecting the semiconductor die to the patterned ends of conductive traces of higher level packaging, such as a carrier substrate.

There is typically a substantial mismatch in the coefficient of thermal expansion (CTE) between the material of the semiconductor die and that of the carrier substrate, such as a printed circuit board or interposer, bearing the conductive traces to which the external conductive elements of the die are bonded. Due to this substantial CTE mismatch, significant stresses develop between the semiconductor die and carrier substrate during normal thermal cycling. Without a strong mechanical attachment of the semiconductor die to the substrate, the die may debond from the carrier substrate, or one or more of the external conductive elements may fracture or release from its corresponding conductive trace. In addition, the small spacing or pitch of the external conductive elements creates a significant potential for shorting between adjacent conductive elements or conductive elements and adjacent carrier substrate traces due to the presence of a dust particle or condensed moisture between the semiconductor die and the carrier substrate. Therefore, when a flip-chip type of electronic device, such as a semiconductor die, is conductively attached to a carrier substrate, underfilling the space between the device and substrate with an electrically insulative material is very desirable to enhance the mechanical bond between the die and the carrier substrate and to dielectrically isolate adjacent electrical connections between the die and the carrier substrate.

In the past, underfilling has been achieved using a dielectric, polymeric material that is heated to a temperature sufficient for it to flow. A vacuum source is typically used to draw the heated, viscous, dielectric material to fill the region between the substrate and the semiconductor die. However, effecting adequate removal of air, water vapor, and moisture from between the substrate and the semiconductor die has always been a problem associated with the conventional underfill process. A more controlled and precise manufacturing technique termed "stereolithography," also known as "layered manufacturing," has been employed recently to form the underfill and encapsulation region in semiconductor packages.

A representative patent disclosing forming the underfill and encapsulation structures of semiconductor device assemblies using stereolithography, assigned to the current assignee of the present application, is U.S. Pat. No. 6,537,482 to Farnworth (hereinafter "the '482 Farnworth Patent"), the disclosure of which is herein incorporated by reference. As shown in FIG. 1, the '482 Farnworth Patent discloses semiconductor device assembly 40 having an underfill and encapsulation region formed using stereolithography. Semiconductor dice 20 having an active surface 22, back side 18, and lateral sides 24 is illustrated having a flip-chip configuration using a ball grid array (BGA) of external conductive elements 30 bonded to a plurality of conductive bond pads 32 contained on the active surface 22. The external conductive elements 30 are bonded to conductive traces 14 on the face 12 of the carrier substrate 10. An underfill structure 50 is formed of a polymerized material that fills the spaces 34 between each semiconductor die 20 and the carrier substrate 10. An encapsulation region or structure 48 formed of a polymerized material, contiguous with the underfill structure 50, seals and protects each semiconductor die 20. The underfill structure 50 and the encapsulation region 48 are formed by immersing the semiconductor device assembly to a predetermined depth in a bath of a liquid photopolymer resin and subsequently curing it using either a controlled light source, thermal process, or both. The process is repeated as necessary to form the complete semiconductor package as exemplified by the semiconductor device assembly 40 shown in FIG. 1.

While the '482 Farnworth Patent provides a useful method for encapsulating and underfilling a semiconductor die to form a semiconductor package, it is limited to forming the underfill and encapsulation regions from a photopolymerizable material having uniform material properties and formed from conventional photopolymerizable materials. Therefore, it is desirable to develop a method that enables varying the photopolymerizable material used to form the underfill and encapsulation regions of the semiconductor package. Furthermore, it would be desirable to tailor the material properties of the photopolymerizable material used to form the underfill and encapsulation structures in specific regions to reduce the thermal stresses experienced by the semiconductor package in service and enable protection of the semiconductor package from external elements.

BRIEF SUMMARY OF THE INVENTION

The present invention, in a number of embodiments, includes underfill and encapsulation structures using a variety of photopolymerizable materials exhibiting differing material properties to package semiconductor devices and assemblies. Methods for fabricating the semiconductor packages employing stereolithography are also disclosed.

In a broad exemplary embodiment, a semiconductor device assembly includes at least one semiconductor die having a back side and an active surface including a plurality of discrete conductive elements projecting therefrom. The discrete conductive elements of the at least one semiconductor die are in electrical communication with a plurality of conductive traces of a carrier substrate. At least a portion of the semiconductor device assembly may be covered with a cured photopolymer material, wherein the cured photopolymer material includes a polymerized matrix having a plurality of discrete particles dispersed therethrough.

In an exemplary embodiment, the discrete particles of the cured photopolymer material may be formed from a material such as, for example, boron nitride, which enables efficient heat transfer from the semiconductor device assembly. The cured photopolymer material may form an underfill structure between the at least one semiconductor die and the carrier substrate. In another exemplary embodiment, the cured photopolymer material may further sealingly enclose the at least one semiconductor die.

In another exemplary embodiment, a first cured photopolymer material may underfill the region between the at least one semiconductor die and the carrier substrate and cover at least portions of the lateral sides of the semiconductor die. A second cured photopolymer material that includes a polymerized matrix having a plurality of discrete particles dispersed therethrough formed from a material such as, for example, boron nitride, may cover the back side of the at least one semiconductor die to form a contiguous structure with the first cured photopolymer material. In another exemplary embodiment, the second cured photopolymer material may exhibit an electrical conductivity greater than that of the first polymerized material forming the underfill structure. The second cured photopolymer material may include a plurality of conductive particles formed from elemental metals or alloys to at least partially surround the at least one semiconductor die and improve electrostatic discharge protection and radio frequency shielding.

In yet another exemplary embodiment, the underfill structure that fills the region between the at least one semiconductor die and the carrier substrate may be formed from at least two layers of cured photopolymer materials. This underfill structure exhibits a coefficient of thermal expansion (CTE) gradient that decreases in a direction from the carrier substrate to the opposing face of the semiconductor die. By tailoring the CTE of each layer of cured photopolymer material, the thermal stresses caused by the CTE difference between the carrier substrate and the at least one semiconductor die may be reduced. Additional photopolymer materials may be used to at least partially enclose the at least one semiconductor die.

In yet another exemplary embodiment, a semiconductor package for packaging an array of optically interactive semiconductor devices is disclosed. An array of optically interactive semiconductor devices may be surrounded by a substantially opaque support structure formed from a first cured photopolymer material. In another exemplary embodiment, a second cured photopolymer material covers the array of optically interactive semiconductor devices to protect the array.

These features, advantages, and alternative aspects of the present invention will be apparent to those skilled in the art from a consideration of the following detailed description taken in combination with the accompanying drawings.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The present invention, in a number of embodiments, employs stereolithography processing to form the packaging for semiconductor devices and semiconductor assemblies. In accordance with the present invention, liquid photopolymerizable resins exhibiting different material properties when cured may be used to form various regions of underfill and encapsulation structures to tailor the material properties thereof for specific applications.

The semiconductor packages of the present invention may be formed using stereolithography systems known in the art. One such system is disclosed in the aforementioned '482 Farnworth Patent. The reader is directed to the disclosure of the '482 Farnworth Patent for specific details; however, the general aspects of the stereolithography system will be elaborated below in the description of FIG. 2.

Figure 1:
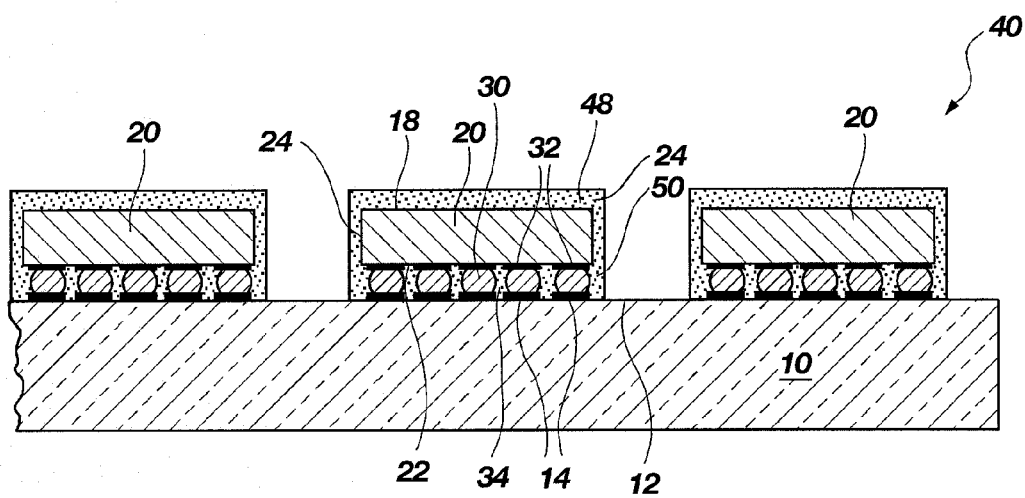
FIG. 1 illustrates a cross-sectional view of a prior art semiconductor device assembly.
Figure 2:
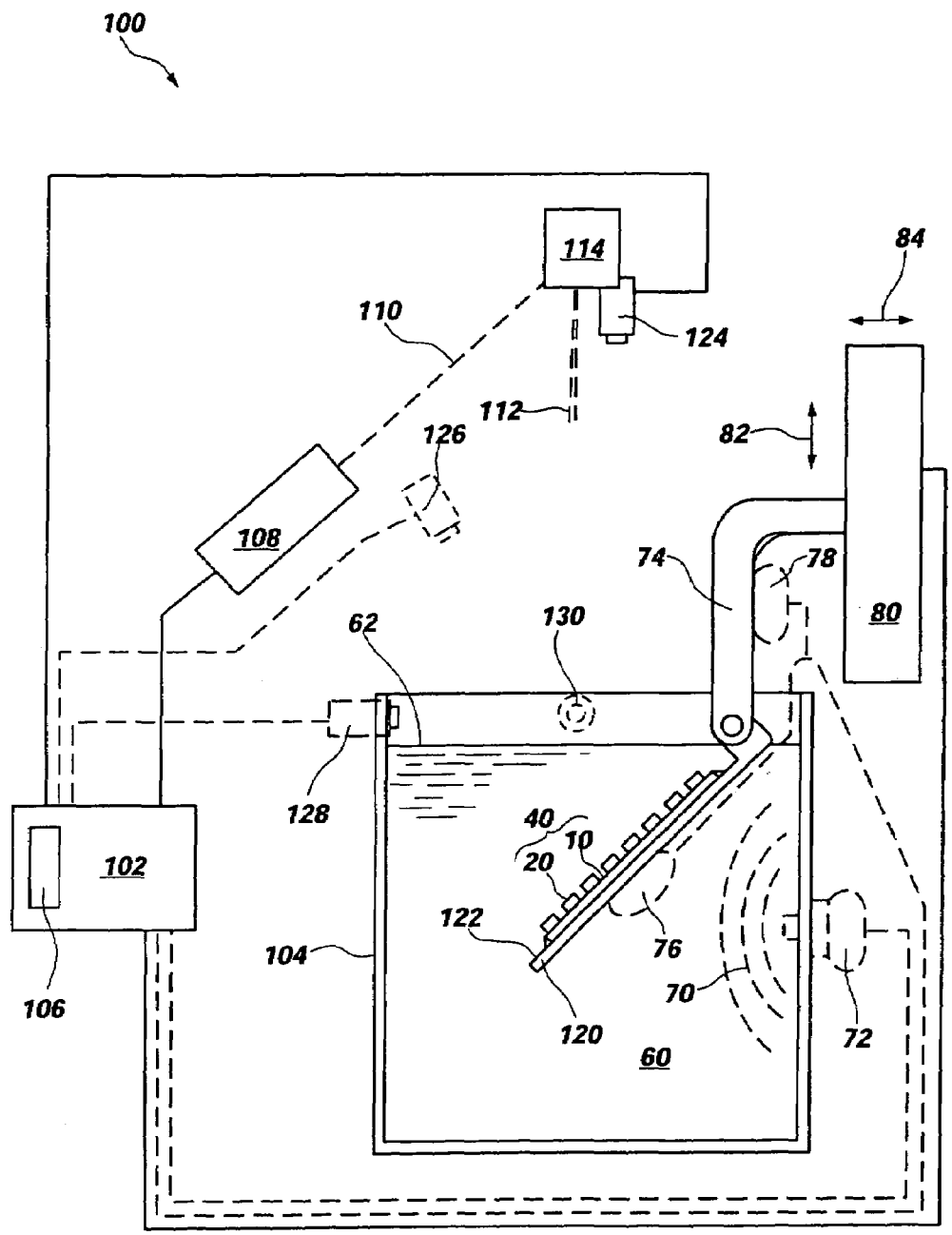
FIG. 2 illustrates a stereolithography apparatus that may be used to practice the present invention.

FIG. 2 schematically illustrates a stereolithography apparatus 100 for underfilling, encapsulating, and forming other various structures for packaging semiconductor devices and assemblies. A plurality of flip-chip semiconductor dice 20 mounted on a carrier substrate 10 is shown in FIG. 2. The apparatus 100 is shown in a purge mode, wherein semiconductor device assembly 40 is mounted on a support surface 122 of a manipulatable support platform 120, tilted and immersed in a reservoir of liquid photopolymer resin 60. Purge mode, as used in the art, means immersing the semiconductor assembly 40 at an angle in order to assist with removal of gases, water vapor, and moisture from the interstitial volume between the carrier substrate 10 and the semiconductor die 20. Platform 120 is supported by and manipulated in a vertical direction 82 and preferably in a horizontal direction 84 as well, by motion actuator 80 acting through arm 74 to insert and remove the semiconductor assembly 40 into the reservoir 104 of liquid photopolymer resin 60. Reservoir 104 may be configured to be removable from the apparatus 100 to enable replacing the reservoir 104 with a different reservoir 104 containing a new liquid photopolymer resin 60 or the reservoir 104 may be drained and re-filled with a new liquid photopolymer resin 60. The motion actuator 80 as well as the generator 72, vibration element 76 or 78 are controlled by a program operating in computer (microprocessor) 102 and stored in memory 106. A generally low-power vibration 70 may be applied to the liquid photopolymer resin 60 by sonic or ultrasonic generator 72 or, alternatively, a vibration element 76 or 78 may be connected to the platform 120. FIG. 2 also illustrates other parts of the stereolithography apparatus 100 not typically used in the purge mode, such as laser 108 configured to project a laser beam 110, beam mirror 114 and camera 124, and optional cameras 126, 128 and 130. As known in the art, a data file containing the structure of the underfill and encapsulation structure, and the intermediate structures to be formed using the stereolithography apparatus 100 are stored in the memory 106 of computer 102. The data files may be a 3-D CAD file or, preferably, a Stereolithography (STL) file as employed by most stereolithography equipment manufacturers.

The semiconductor assembly 40 supported by platform 120 may be immersed into the reservoir 104 of liquid photopolymer resin 60 covering the semiconductor device assembly 40 with a precise amount of liquid photopolymer resin 60. While still submerged and positioned to be substantially horizontal, the layer of liquid photopolymer covering the semiconductor assembly 40 may then be irradiated by the beam 112 to cure or partially cure at least a portion of it. The individual stereolithographic acts required to form the underfill and encapsulation structures of the present invention are discussed in more detail below with respect to FIGS. 3-12. The surface level 62 of the liquid photopolymer resin 60 is automatically maintained at an extremely precise, constant magnitude by devices known in the art responsive to output of level sensors, not shown, within the apparatus 100 and preferably under control of computer 102.

The semiconductor packages of the present invention may use polymerized materials formed by modifying a variety of commercially available liquid photopolymer resins 60. Suitable photopolymers for use in practicing the present invention include, without limitation, ACCURA® SI 40 HC and AR materials and CIBATOOL SL 5170 and SL 5210 resins for the SLA® 250/50HR and SLA® 500 systems, ACCURA® SI 40 ND material and CIBATOOL SL 5530 resin for the SLA® 5000 and 7000 systems, and CIBATOOL SL 7510 resin for the SLA® 7000 system. The ACCURA® materials are available from 3D Systems, Inc., of Valencia, Calif., while the CIBATOOL resins are available from Ciba Specialty Chemicals Inc. of Basel, Switzerland. Additional photopolymers that are suitable for use in practicing the present invention include, without limitation, LOCTITE® 5071, 5084, 5088, and 5089 silicone-based materials available from Henkel Loctite Corp., of Industry, California. The liquid photopolymer resins 60 may be mixed with a particulate filler constituent to enable tailoring and adjustment of the material properties of photopolymer upon being cured. The particulate filler constituent is typically in the range of about 5 μm to 15 μm in particle size, so as to be small enough to fill any voids and other features into which the liquid photopolymer is to flow. However, the size of the particulate filler constituent is not critical within the foregoing constraint and may be selected to enable a substantially uniform distribution of suspended particles within the liquid photopolymer resin 60 and to prevent agglomeration of the particles. Exemplary filler constituents may be selected from boron nitride, silicates, elemental metals, and alloys. Thus, by selecting the appropriate filler constituent, the physical properties of the polymerized material may be tailored to fulfill the needs of particular applications. A more thermally conductive polymerized material may be formed by adding a filler constituent, such as boron nitride, that exhibits a thermal conductivity greater than that of the liquid photopolymer resin 60 it is dispersed therethrough. The CTE of the polymerized material may be decreased by adding a filler constituent having a CTE that is less than the CTE of the liquid photopolymer resin 60 in a cured, unfilled state. The degree of CTE adjustment may, of course, be dependent on the filler volume and particle size employed. Exemplary filler constituents for decreasing the CTE of polymerized material include filler constituents such as, for example, silicates or boron nitride. The electrical conductivity of the polymerized material may, also, be increased relative to the liquid photopolymer resin 60 by adding a conductive filler constituent such as, for example, elemental metals or alloys. The degree to which the filler constituents alter the physical properties of the liquid photopolymer resin 60 is generally governed by a rule of mixtures type of formula. Upon curing or at least partially curing to at least a semisolid state, the cured photopolymer material exhibits a polymerized matrix having a plurality of discrete particles (i.e., the filler constituent) dispersed therethrough.

The liquid photopolymer resin 60 is responsive to light in the UV wavelength range such that it at least partially cures or polymerizes upon exposure to UV wavelength light to form a semisolid structure. The liquid photopolymer resin 60 may also be cured by other means, such as elevated temperature, to become a fully cured polymeric structure. Furthermore, with regard to the liquid photopolymer resins 60 that include filler constituents, as the volume percent of the filler constituent is increased in the liquid photopolymer resin 60, the thickness that may be partially cured using UV light to a semisolid state decreases. A thickness of about $18 \times 10^{-3}$ inches may be partially cured to a semisolid state if the liquid photopolymer resin 60 does not possess any filler constituent. A thickness of about $4.5 \times 10^{-3}$ inches may be partially cured to a semisolid state if the liquid photopolymer resin 60 possesses about 50 volume percent filler constituent.

Figure 3:
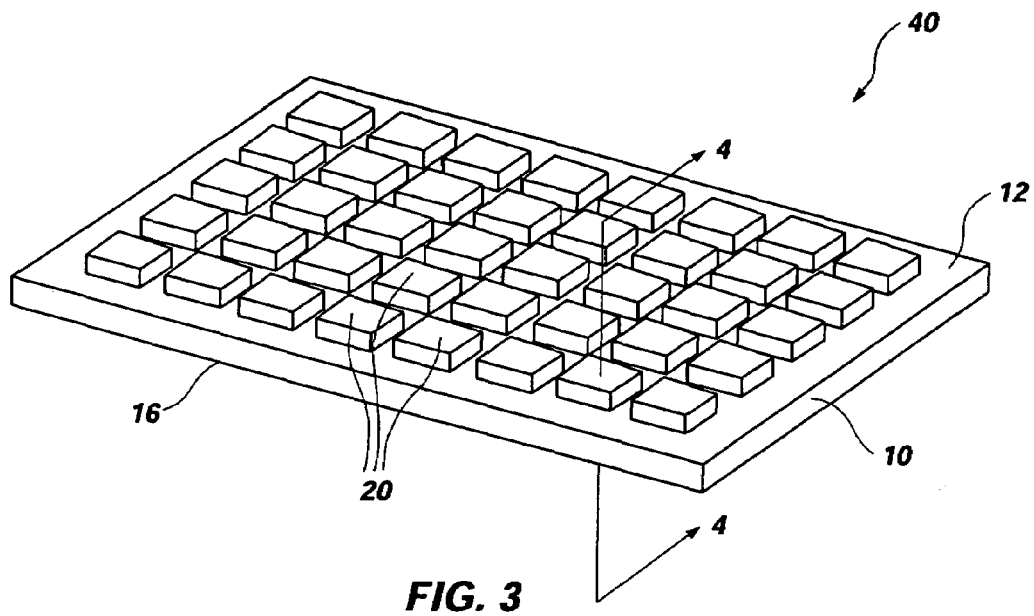
FIG. 3 illustrates a perspective view of an exemplary semiconductor device assembly having a flip-chip configuration.
Figure 4:
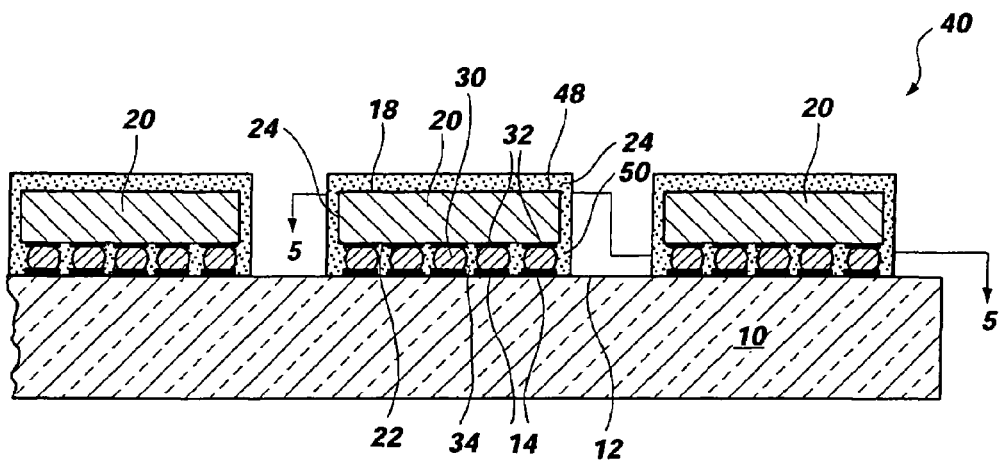
FIG. 4 illustrates a cross-sectional view of the semiconductor device assembly of FIG. 3 taken along line 4-4.
Figure 5:
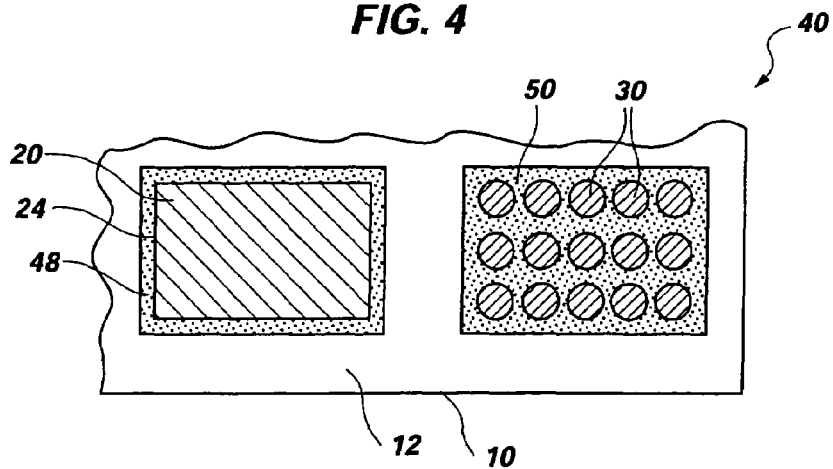
FIG. 5 illustrates a cross-sectional view of the semiconductor device assembly of FIG. 4 taken along line 5-5.

An exemplary semiconductor device assembly 40 formed in accordance with the present invention is shown in FIGS. 3, 4 and 5. The semiconductor device assembly 40 comprises a carrier substrate 10 such as a printed circuit board, interposer or other substrate to which external conductive elements 30 such as conductive balls, bumps or columns protruding from the active surface 22 of one or more flip-chip semiconductor dice 20 are bonded through conductive traces 14 on the planar carrier substrate face 12. The exemplary carrier substrate 10 is shown as having a generally planar back side 16. However, the method may be applied to carrier substrates 10 and semiconductor dice 20 of any configuration, where a volume or space therebetween requires underfilling. The present invention comprises a method for underfilling the volume between a semiconductor die 20 mounted on a carrier substrate 10 and encompasses extension of the underfill to encapsulate the semiconductor die 20 in the same process.

In FIG. 4, exemplary semiconductor dice 20 are illustrated as having a flip-chip configuration, each having a ball grid array (BGA) of external conductive elements 30 such as solder balls or conductive or conductor-filled epoxy on active surface 22, and having a back side 18 and lateral sides 24. The external conductive elements 30 are shown as being bonded to the plurality of conductive bond pads 32 on the active surface 22 and to conductive traces 14 on the face 12 of carrier substrate 10. The external conductive elements 30 may be bonded to the conductive traces 14 by heat-induced reflow in the case of solder or by curing in the case of epoxy, using any effective method such as is known in the art.

As shown in FIGS. 4 and 5, an underfill structure 50 formed of a cured photopolymer material essentially fills the interstitial volume or spaces 34 between each semiconductor die 20 and the carrier substrate 10, including the crevices where the external conductive elements 30 meet the active surface 22 and the carrier substrate face 12. The underfill structure 50 is tightly adhered to the active surface 22 and the carrier substrate face 12 to mechanically attach the semiconductor die 20 to the carrier substrate 10. Contiguous with the underfill structure 50 is an encapsulation structure of region 48 of protective cured photopolymer material which is shown as covering the four lateral sides 24 and back side 18 of each semiconductor die 20. The underfill structure 50, together with the encapsulation structure 48, form a polymeric protective package, that seals and protects each semiconductor die 20. Because of the unique method by which the underfill structure 50 is formed, there are essentially no bubbles of air or other gas, water vapor, or moisture in any other form within the underfill structure 50. Thus, any opportunity for short-circuiting between external conductive elements 30, the plurality of conductive bond pads 32, and conductive traces 14 is virtually eliminated. Further, the highly conformal underfill structure helps to support the external conductive elements 30.

Referring to FIG. 4, in an exemplary embodiment of the present invention, the underfill structure 50 and the encapsulation structure 48 may be formed from a thermally conductive polymerized material. The polymerized material may be formed from a liquid photopolymer resin 60 that includes a filler constituent such as, for example, boron nitride for increasing the thermal conductivity thereof. By forming the underfill structure 50 and the encapsulation structure 48 from a polymerized material of enhanced thermal conductivity, heat transfer from the semiconductor die 20 during service is improved.

Figure 6A:
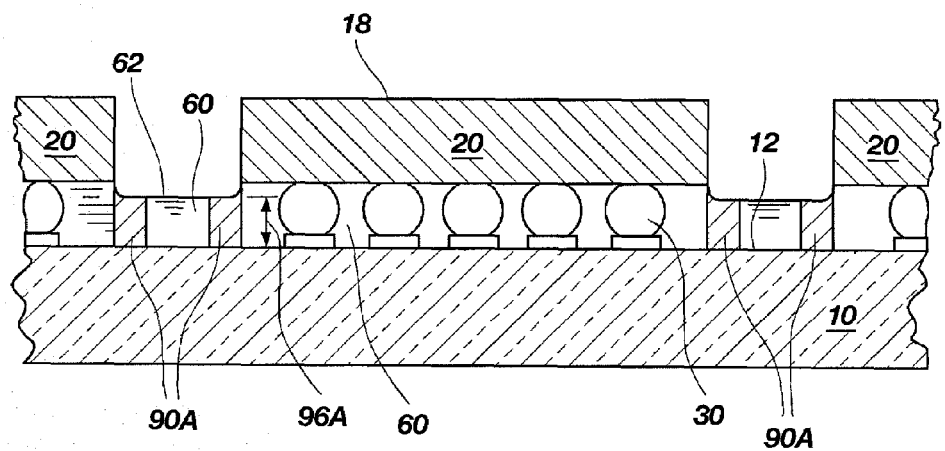
FIGS. 6A through 6C illustrate an exemplary method for fabricating the present invention.
Figure 6B:
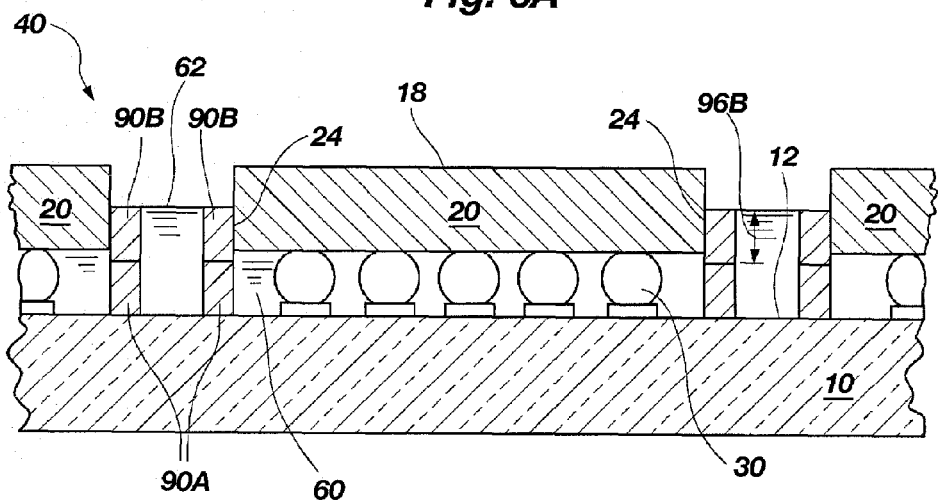

An exemplary method for forming the underfill structure 50 and encapsulation structure 48 is described with reference to FIGS. 6A-6C. The semiconductor assembly 40 is immersed in the reservoir 104 of liquid photopolymer resin 60 to a predetermined depth 96A below the surface level 62 of the liquid photopolymer resin 60. The laser 108 scans the liquid photopolymer resin 60 in selected portions to at least partially cure (partially polymerize) the liquid photopolymer resin 60 to form structures 90A that retain an uncured pool of the liquid photopolymer resin 60 between the carrier substrate 10 and the semiconductor die 20, as shown in FIG. 6A. As shown in FIG. 6B, the semiconductor assembly 40 may be further immersed to a predetermined depth 96B below the surface level 62 of the liquid photopolymer resin 60. Again, the laser 108 scans the liquid photopolymer resin 60 in selected portions to form another partially cured structure 90B that is bonded to, and contiguous with, the structure 90A, as shown in FIG. 6B. As depicted, for illustrative purposes in FIG. 6B, structures 90A and 90B form a dam structure that sealingly retains liquid photopolymer resin 60 between the carrier substrate face 12 and the semiconductor die 20. Although the process is illustrated using only two layers (i.e., structures 90A and 90B), fewer layers may be used or additional layers may be used, as required, to form additional dam structures. The number of layers used in this iterative process is determined by thickness of liquid photopolymer resin 60 that may be partially cured by the laser 108 into a semisolid state.

Figure 6C:
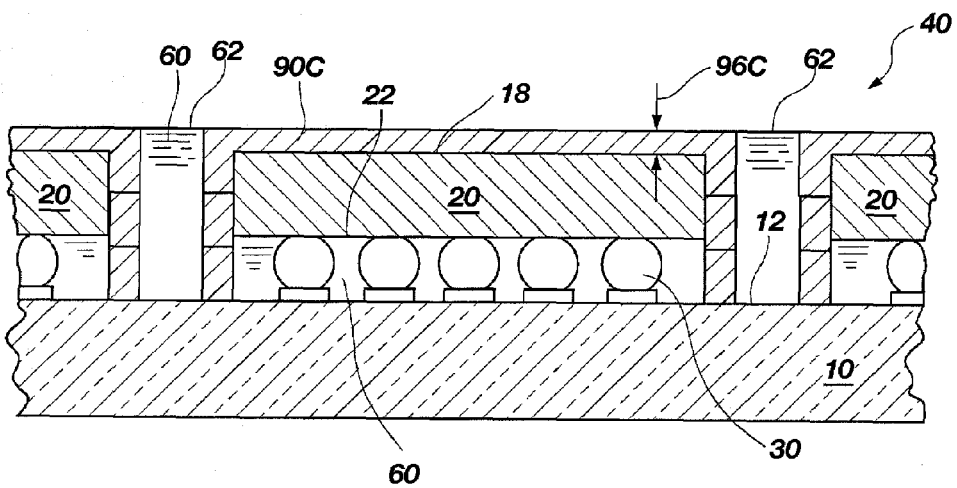

As illustrated in FIG. 6C, the process is repeated, to further submerge the back side 18 of the semiconductor die 20 to a predetermined depth 96C below the surface level 62 of the reservoir 104 (FIG. 2) to at least partially cure the liquid photopolymer resin 60 to complete the encapsulation structure 48 by forming structure 90C. The liquid photopolymer resin 60 remaining on the semiconductor device assembly 40 is then drained. However, the interstitial volume between the carrier substrate face 12 and the semiconductor die 20 is filled with the liquid photopolymer resin 60 that is sealingly retained therebetween by structures 90A and 90B. The partially cured structures that comprise the encapsulation structure 48 and the uncured liquid photopolymer remaining sealed between the carrier substrate face 12 and semiconductor die 20 may be fully cured by moving the semiconductor device assembly 40 to another apparatus, such as a furnace, to fully cure both the partially cured structure comprising the encapsulation structure 48 and the underfill structure 50 by heating to an elevated temperature to form a contiguous unitary structure. The resultant fully cured encapsulation structure 48 and underfill structure 50 is shown in the aforementioned FIG. 4.

Figure 7:
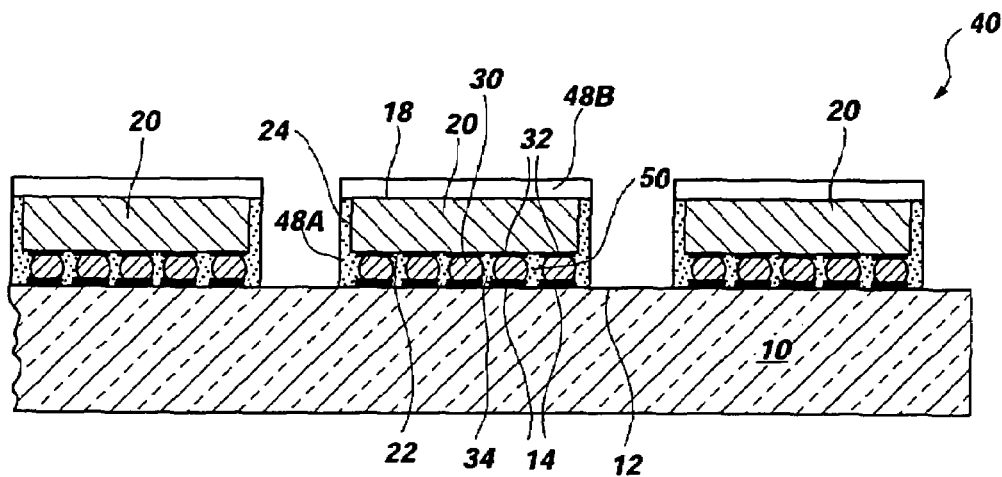
FIG. 7 illustrates a cross-sectional view of another exemplary semiconductor device assembly employing two different types of photopolymer materials to form the semiconductor package.

Referring to FIG. 7, in another exemplary embodiment of the present invention, the encapsulation structure 48A substantially covering the four lateral sides 24 and the underfill structure 50 filling the spaces 34 between each semiconductor die 20 and the carrier substrate 10 may be formed from a dielectric polymerized material. The dielectric polymerized material may be formed from a conventional liquid photopolymer resin 60 such as the aforementioned commercially available photopolymers resins (i.e., without an additional filler constituent). Such dielectric polymerized materials are thermal insulators. The encapsulation structure 48A formed from the same dielectric material as underfill structure 50 is contiguous with the underfill structure 50 and substantially covers the four lateral sides 24 of the semiconductor die 20. The encapsulation structure 48B may be formed from a photopolymer material exhibiting thermally conductive properties greater than that of the polymerized material used for the encapsulation structure 48A and the underfill structure 50. Thus, the photopolymer material employed for forming the encapsulation structure 48B may be formed from a liquid photopolymer resin 60 that includes a filler constituent such as, for example, boron nitride for increasing the thermal conductivity thereof. As with the embodiment shown in FIG. 4, by forming the encapsulation region 48B from a thermally conductive polymerized material, more efficient heat transfer from semiconductor die 20 is effected.

The underfill structure 50 and the encapsulation structures 48A and 48B of the embodiment shown in FIG. 7 may be formed in a similar manner to that described in the aforementioned FIGS. 6A-6C. The encapsulation structure 48A may be formed by immersing the semiconductor device assembly 40 and selectively partially curing the liquid photopolymer resin 60 by exposure to laser 108 to substantially surround the four lateral sides 24 of the semiconductor die 20 and sealingly retain liquid photopolymer resin 60 in the space between the carrier substrate face 12 and the semiconductor die 20. The encapsulation structure 48A may be formed using an iterative process that builds the encapsulation structure 48A from multiple layers, if needed. The remaining liquid photopolymer resin 60 is drained from the semiconductor device assembly 40. The liquid photopolymer resin 60 is replaced in the reservoir 104 with a liquid photopolymer resin 60 that includes a filler constituent such as, for example, boron nitride for increasing the thermal conductivity thereof or the entire reservoir 104 may be replaced. Alternatively, reservoir 104 may be replaced with another reservoir 104 containing the liquid photopolymer resin 60 with the filler constituent, or the assembly transferred to another stereolithography apparatus 100 including a reservoir 104 with the particle-filled liquid photopolymer resin 60. The semiconductor device assembly 40 is then immersed in the liquid photopolymer resin 60 that includes a filler constituent and the encapsulation region 48B is partially cured by exposure to the laser 108. The encapsulation structure 48A including the uncured liquid photopolymer resin 60 retained between the carrier substrate 10 and the semiconductor die 20 and encapsulation structure 48B are then fully cured by heating to an elevated temperature.

Figure 8A:
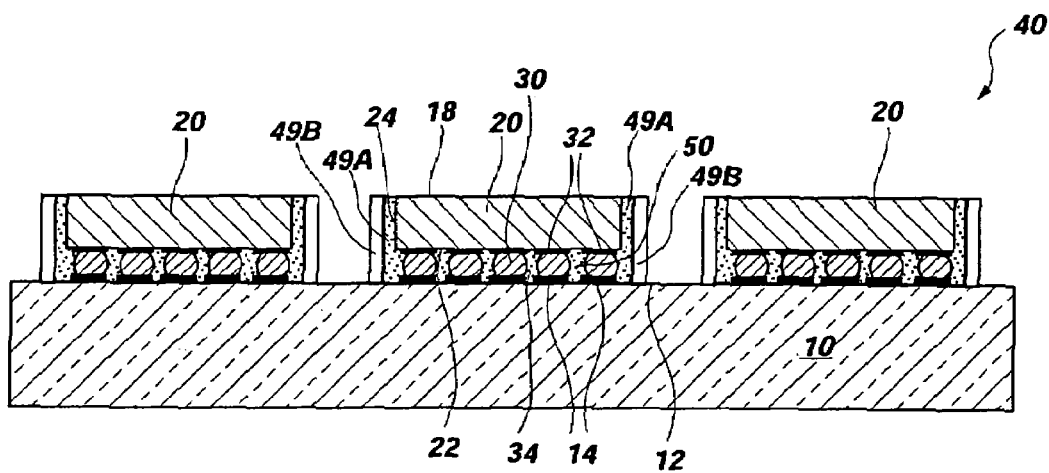
FIGS. 8A and 8B illustrate cross-sectional views of exemplary semiconductor device assemblies employing two different types of photopolymer materials to form the semiconductor package.
Figure 8B:
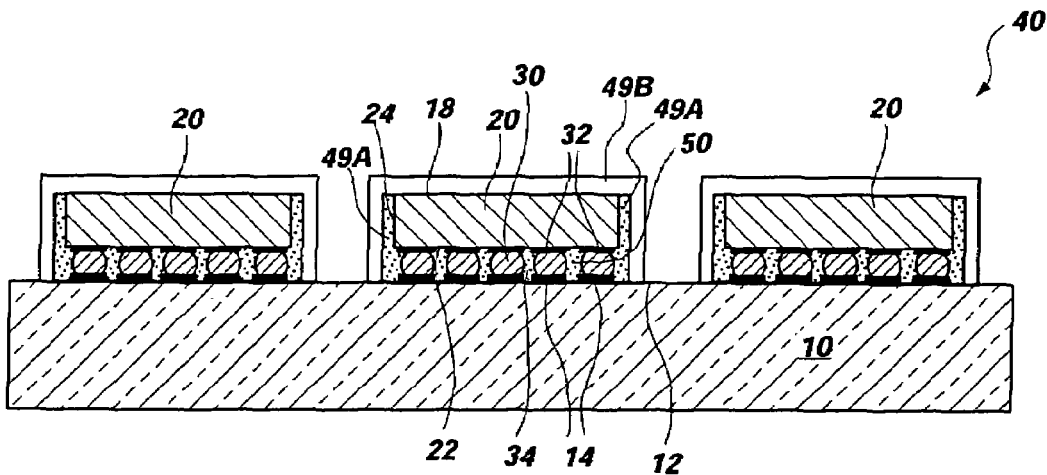

Referring to FIGS. 8A and 8B, in another exemplary embodiment, the underfill structure 50 filling the spaces 34 between each semiconductor die 20 and the carrier substrate 10 and the encapsulation structure 49A that covers the four lateral sides 24 of the semiconductor die 20 may be formed from a dielectric polymerized material. The dielectric polymerized material may be formed from a conventional liquid photopolymer resin 60 such as the aforementioned commercially available photopolymers (i.e., lacking an additional filler constituent). As shown in FIG. 8A, the encapsulation structure 49B may partially enclose each semiconductor die 20 including the underfill structure 50 and the encapsulation structure 49A to cover the lateral sides of each semiconductor die 20. The encapsulation structure 49B may also cover the back side 18 of each semiconductor die 20 to completely enclose each semiconductor die 20 as shown in FIG. 8B. The encapsulation structure 49B may be formed from a photopolymer material exhibiting properties that enable electrostatic discharge (ESD) protection and radio frequency (RF) shielding. A suitable photopolymer material employed for forming the encapsulation structure 49B may be formed from a liquid photopolymer resin 60 that includes a filler constituent such as, for example, an elemental metal or alloy for increasing the electrical conductivity thereof. The encapsulation structure 49B, formed from a cured photopolymer material, exhibits a sufficient electrical conductivity to assist with ESD protection and RF shielding.

The underfill structure 50 and the encapsulation structures 49A and 49B of the embodiment shown in FIG. 8 may be formed in a similar manner to that described in the aforementioned FIGS. 6A-6C. The encapsulation structure 49A may be formed by immersing the semiconductor device assembly 40 and partially curing the liquid photopolymer resin 60 by exposure to laser 108 to substantially surround the four lateral sides 24 of the semiconductor die 20 and sealingly retain liquid photopolymer resin 60 in the space between the carrier substrate face 12 and the semiconductor die 20. The encapsulation structure 49A may be formed using an iterative process that builds the encapsulation structure 49A from multiple layers. The remaining liquid photopolymer resin 60 is drained from the semiconductor device assembly 40. The semiconductor device assembly 40 is then immersed in the liquid photopolymer resin 60 that includes a filler constituent such as, for example, an elemental metal or alloy for increasing the electrical conductivity thereof and the encapsulation structure 49B is partially cured by exposure to a laser 108 in multiple layers depending on the height of the encapsulation structure 49B. The encapsulation structure 49A including the uncured liquid photopolymer resin 60 retained between the carrier substrate 10 and the semiconductor die 20, encapsulation structure 49B, and the underfill structure 50, are then fully cured by heating to an elevated temperature.

Figure 9A:
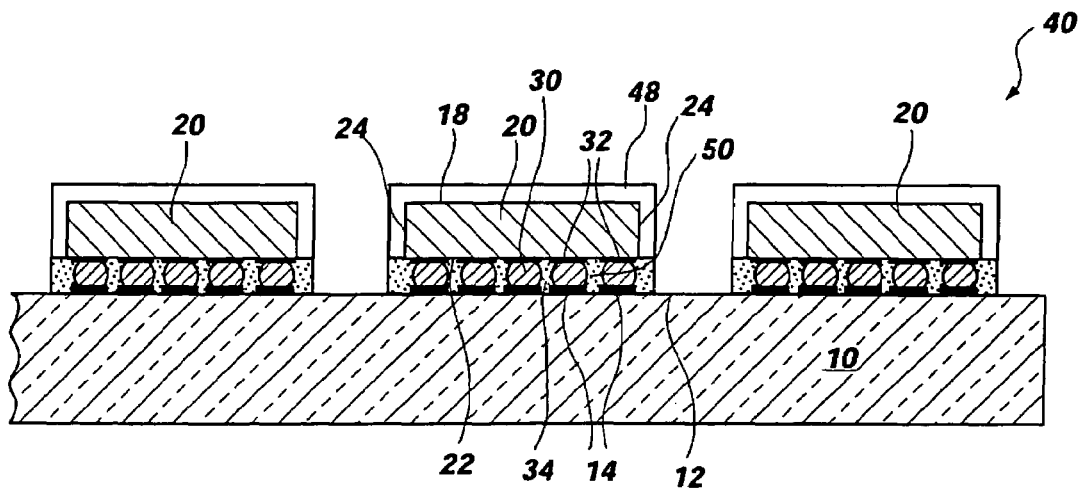
FIGS. 9A through 9C illustrate a cross-sectional view of another exemplary semiconductor device assembly having a layered underfill structure.
Figure 9B:
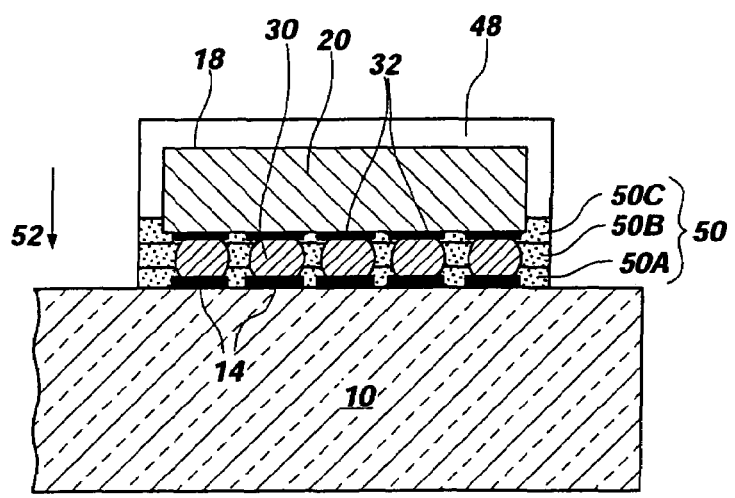

Referring to FIGS. 9A and 9B, in another exemplary embodiment, the underfill structure 50 may be comprised of multiple layers, wherein each layer exhibits a different CTE. The CTE of the layer nearest to the active surface 22 of the semiconductor die 20 closely matches that of the CTE of the semiconductor die 20, while the CTE of the layer nearest the carrier substrate face 12 closely matches the CTE of the carrier substrate 10. The CTE of each layer of cured photopolymer material that comprises the underfill structure 50 progressively increases in a direction from the active surface 22 of the semiconductor die 20 to the carrier substrate face 12, with the CTE of the layer closest to the carrier substrate face 12 closely matching the CTE of the carrier substrate 10. This CTE gradient that increases from the active surface 22 of the semiconductor die 20 to the face 12 of the carrier substrate 10 alleviates the thermal stresses that develop during use of the semiconductor assembly 40 due to the substantial CTE mismatch between the semiconductor die 20 and the carrier substrate 10.

FIG. 9B illustrates a more detailed cross-sectional view of a single semiconductor die 20 mounted on carrier substrate 10 employing a layered underfill structure 50. The underfill structure 50 may be comprised of multiple layers of a photopolymer material, wherein the CTE of each layer increases in the direction 52. Layer 50A may be comprised of, for example, a polymerized material having a CTE between about 15 to about 35 ppm. Layer 50B may be comprised of, for example, a photopolymer material having a CTE between about 8 to about 15 ppm. Layer 50C may be comprised of, for example, a photopolymer material having a CTE between about 5 to about 10 ppm. In the exemplary embodiment illustrated in FIGS. 9A and 9B, the CTE of the photopolymer material may be altered by adding a filler constituent such as, for example, silicates or boron nitride to the liquid photopolymer resin 60. The addition of silicates or boron nitride to the liquid photopolymer resin 60 decreases the CTE upon curing to form the polymerized material and the CTE may be adjusted by varying the volume of filler, particle size and material of the filler. Although the underfill structure 50 is shown being comprised of only three layers (50A-50C), it may comprise additional or fewer layers, if desired. Additionally, the encapsulation structure 48 may be comprised of a thermally conductive photopolymer material. The photopolymer material used for the encapsulation structure 48 may be formed from a liquid photopolymer resin 60 that includes a filler constituent such as, for example, boron nitride for increasing the thermal conductivity thereof. In addition, the entire underfill structure 50 and encapsulation structure 48 may be at least partially surrounded or completely enclosed by an electrically conductive photopolymer material 53, as shown in FIG. 9C, to enable ESD protection and RF shielding of the semiconductor die 20.

Figure 9C:
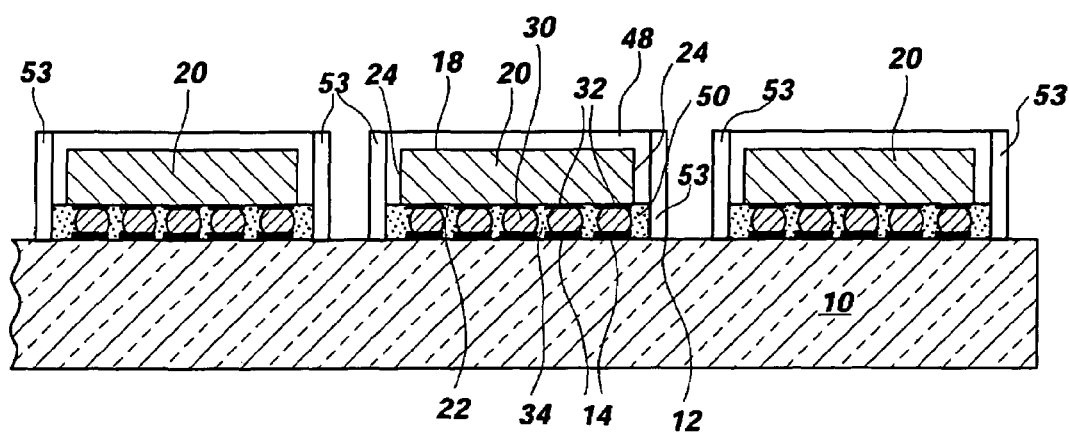
Figure 10A:
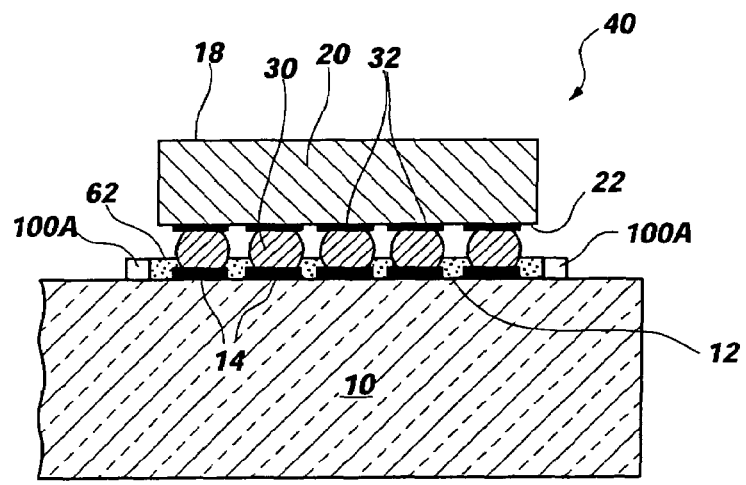
FIGS. 10A through 10C illustrate an exemplary process for forming the underfill and encapsulation structure shown in FIGS. 9A through 9C.
Figure 10B:
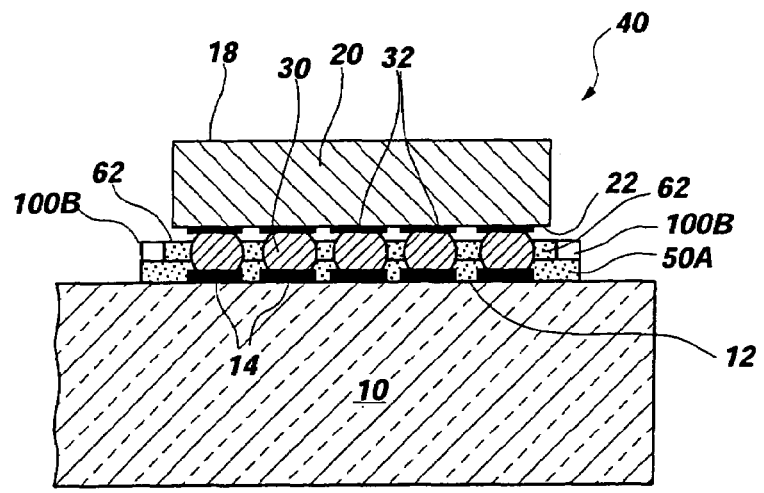
Figure 10C:
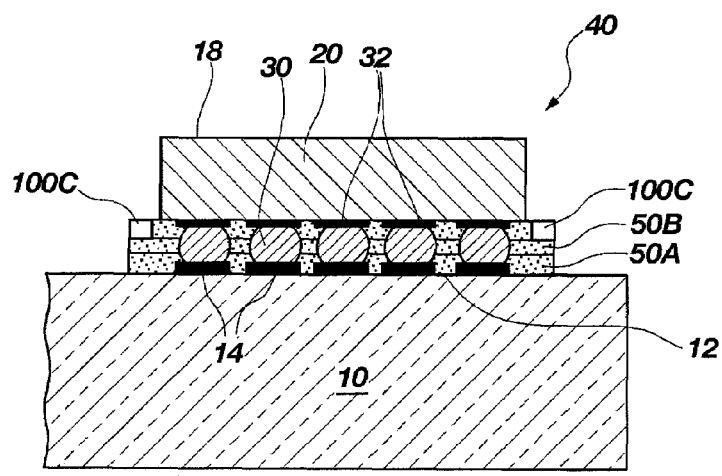

FIGS. 10A-10C briefly illustrate a process for forming the underfill structure 50 and encapsulation structure 48 shown in FIGS. 9A-9C. Referring to FIG. 10A, layer 50A of the underfill structure 50 may be formed by immersing the semiconductor device assembly 40 to a predetermined depth and partially curing the liquid photopolymer resin 60 by exposure to laser 108 to form structure 100A which completely surrounds the four lateral sides 24 of the semiconductor die 20. The semiconductor device assembly 40 is removed from the reservoir 104 and the excess liquid photopolymer resin 60 is drained. However, there remains uncured, liquid photopolymer resin 60 of a surface level 62 retained by structure 100A between the carrier substrate face 12 and the semiconductor die 20. The semiconductor device assembly 40 is then moved to an external heat source such as a quartz lamp or oven to cure, or at least partially cure, the remaining liquid photopolymer resin 60 retained between the carrier substrate face 12 and the semiconductor die 20 to form a unitary layer 50A. The liquid photopolymer resin 60 is replaced in the reservoir 104 with a second liquid photopolymer resin 60 that has a lower CTE than the liquid photopolymer resin 60 used for layer 50A, or the reservoir 104 may be replaced, or the assembly moved to a different stereolithography apparatus 100. Referring to FIG. 10B, the semiconductor device assembly 40 is immersed in the second liquid photopolymer resin 60 and partially cured by exposure to the laser 108 to form structure 100B that is bonded to and contiguous with layer 50A. The semiconductor device assembly 40 is removed from the reservoir 104 and the excess liquid photopolymer resin 60 is drained. As with forming the first layer 50A, there remains uncured, liquid photopolymer resin 60 of a surface level 62 retained by structures 100A and 100B between layer 50A and the semiconductor die 20. The semiconductor device assembly 40 is then moved to an external heat source to cure, or at least partially cure, the remaining liquid photopolymer resin 60 retained between the layer 50A and the semiconductor die 20 to form a unitary layer 50B. The liquid photopolymer resin 60 is replaced in the reservoir 104 with a third liquid photopolymer resin 60 that has a lower CTE than the liqu id photopolymer resin 60 used for layers 50A and 50B, or the entire reservoir 104 may be replaced, or the assembly moved to another stereolithography apparatus 100.

Referring to FIG. 10C, the semiconductor device assembly 40 is then immersed in the third liquid photopolymer resin 60 and partially cured by exposure to the laser 108 to form structure 100C that is bonded to and contiguous with structure 100B. Structure 100C sealingly retains uncured, liquid photopolymer resin 60 between the layer 50B and the semiconductor die 20. The semiconductor device assembly 40 is removed from the reservoir 104 and the excess liquid photopolymer resin 60 is drained. As with forming the previous layers 50A and 50B, there remains uncured, liquid photopolymer resin 60 retained between the layer 50B and the semiconductor die 20. The semiconductor device assembly 40 may then be moved to an external heat source to cure, or at least partially cure, the remaining liquid photopolymer resin 60 retained between the layer 50B and the semiconductor die 20 to form a unitary layer 50C that seals and protects each semiconductor die 20. The encapsulation structure 48 may be formed by immersion of the semiconductor device assembly 40 to a predetermined depth within another reservoir 104 and subsequent exposure by a laser 108 to form the encapsulation structure 48 that is contiguous with the underfill structure 50 and covers the back side 18 of the semiconductor die 20, prior to or after forming unitary layer 50C. If desired, the semiconductor device assembly 40 may be immersed in a reservoir 104 containing a liquid photopolymer resin 60 that includes containing a filler constituent for increasing the electrical conductivity thereof and subsequently, partially curing by exposure to the laser 108 to form the electrically conductive polymerized material 53, as shown in FIG. 9C. The partially polymerized photopolymer materials that comprise the underfill structure 50, encapsulation structure 48, and if present, the electrically conductive photopolymer material 53 may be fully cured by heating to an elevated temperature.

Figure 11A:
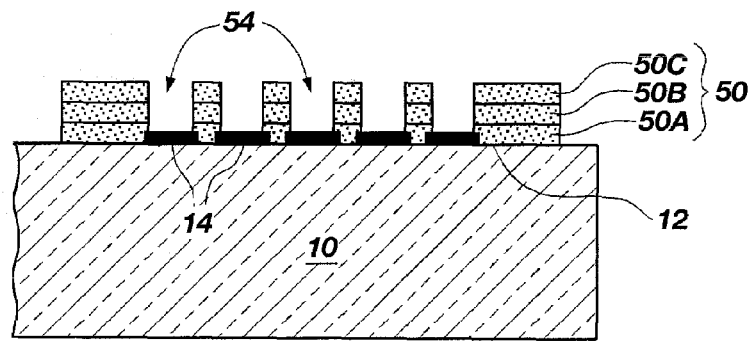
FIGS. 11A through 11C illustrate another exemplary process for forming the underfill and encapsulation structure shown in FIGS. 9A-9C.
Figure 11B:
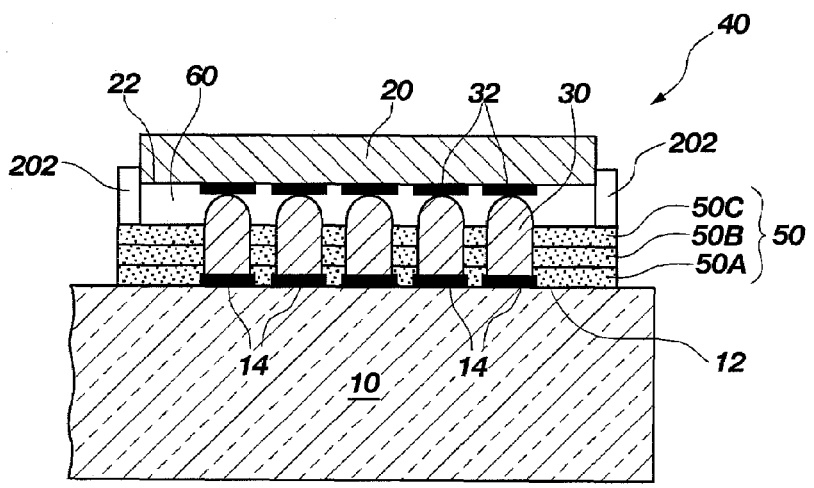
Figure 11C:
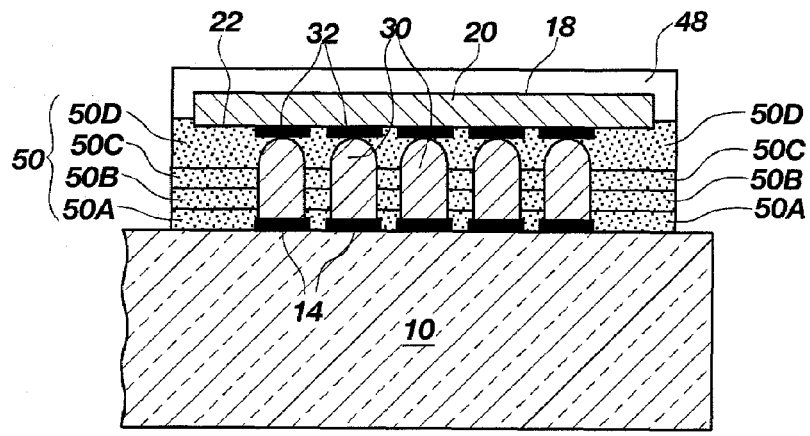

FIGS. 11A-11C briefly illustrate another exemplary process for forming the layered underfill structure 50 and encapsulation structure 48 shown in FIGS. 9A-9C. As depicted in FIG. 11A, the layered underfill structure 50 may be formed on the carrier substrate face 12 with apertures 54 that expose the conductive traces 14. The external conductive elements 30, such as conductive or conductor-filled epoxy pillars or solder balls, may be stenciled so as to be deposited within apertures 54 contacting the conductive traces 14. Referring to FIG. 11B, conductive traces 14 and conductive bond pads or redistributed bond pads 32 on the active surface 22 of the semiconductor die 20 may be bonded to the external conductive elements 30 as known in the art, such as by solder reflow or by heating to cure and bond the epoxy pillars to the conductive traces 14 and bond pads 32. Also illustrated in FIG. 11B, the semiconductor device assembly 40 may then be immersed in the reservoir 104 to a predetermined depth and subsequently exposed to laser 108 to partially cure structures 202 that are bonded to and contiguous with layer 50C and sealingly retains uncured, liquid photopolymer resin 60 between the layer SOC and the semiconductor die 20. If desired, the entire assembly may be cured by heating to an elevated temperature to fully cure all of the layers 50A-50D that comprise the underfill structure 50 as shown in FIG. 11C. An encapsulation structure 48 may be formed by immersion of the semiconductor device assembly 40 to a predetermined depth within a reservoir 104 containing a liquid photopolymer resin 60 and subsequent exposure by laser 108 to form the encapsulation structure 48 that is contiguous with the underfill structure 50 and covers the back side 18 of the semiconductor die. The encapsulation structure 48 may be formed prior to or after fully curing the underfill structure 50. Although not shown, if desired, additional encapsulation regions and/or structures may be formed as performed in the previous embodiments to at least partially enclose the semiconductor die 20 using an electrically conductive polymerized material to assist with ESD and RF shielding.

Figure 12A:
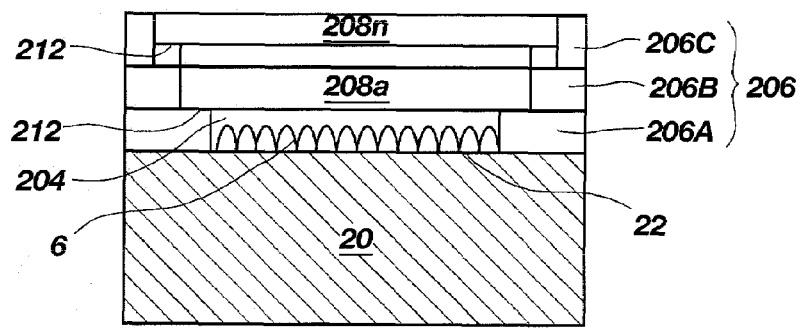
FIGS. 12A and 12B illustrate cross-sectional views of an optically interactive semiconductor device packaged using various photopolymer materials.
Figure 12B:
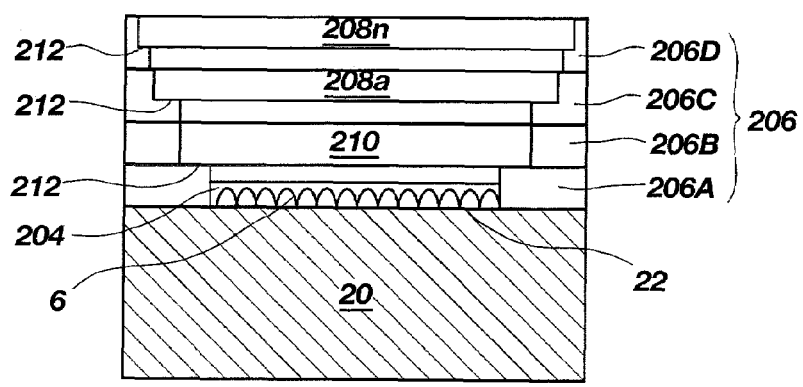

Referring to FIGS. 12A and 12B, a cross-sectional view of an optically interactive semiconductor device that is packaged using various photopolymer materials is illustrated. Semiconductor die 20 includes an array 6 of optically interactive semiconductor devices such as, for example, CCD image sensors or CMOS image sensors on its active surface 22. An array 6 of optically interactive semiconductor devices may include a cover 204 formed from a photopolymer material that seals and protects array 6 and is transparent to light, preferably in the 400 nm to 650 nm wavelength range. In an exemplary embodiment shown in FIG. 12A, cover 204 may be formed from an optically transparent photopolymerized material that filters infrared (IR) radiation. The array 6 of optically interactive semiconductor devices may also be surrounded along substantially all of its periphery by a support structure 206 including ledges 212 that supports at least one lens 208a-208n for focusing light onto the array 6. Support structure 206 may be formed from a photopolymerized material that is opaque. Suitable photopolymer materials for forming support structure 206 are any of the above mentioned commercially available liquid photopolymer resins or a photopolymer material that comprises a polymerized matrix having a filler constituent such as, for example, an elemental metal or alloy dispersed therethrough. For example, a photopolymer material that comprises approximately 50 volume percent of a metallic particulate filler constituent will be substantially opaque and suitable for forming the support structure 206. Thus, the photopolymer material that comprises support structure 206 may shield array 6 of optically interactive semiconductor devices, substantially allowing only light entering through a lens 208 to be received by the array 6. If cover 204 is formed from a photopolymer material that absorbs IR radiation, a traditional IR filter is not needed.

An IR filter 210 is necessary to filter IR radiation from being received by the array 6 if cover 204 does not absorb IR radiation. As shown in FIG. 12B, an IR filter 210 and at least one lens 208a-208n may be supported by ledges 212 of the support structure 206. Cover 204 formed from an optically transparent photopolymer may, optionally, be used to seal and protect array 6. Although, not shown in FIGS. 12A and 12B, it should be understood that the semiconductor die 20 includes external conductive elements for electrically connecting semiconductor die 20 to other semiconductor devices or higher level packaging, such as a printed circuit board. Such external conductive elements may also be formed using stereolithographic techniques, as desired.

The package for the optically interactive semiconductor device may be formed using stereolithography methods similar to those used in the previous embodiments. The semiconductor die 20 may be immersed in the liquid photopolymer resin 60 to the desired depth. The liquid photopolymer resin 60 may be scanned by laser 108 to cure or at least partially cure a portion thereof to form cover 204 that covers the array 6. Cover 204 may be formed, if needed, by multiple iterative steps to build up cover 204 from multiple layers. The liquid photopolymer resin 60 may then be changed to another and the semiconductor die 20 re-immersed therein. The liquid photopolymer resin 60 is scanned by laser 108 to cure, or at least partially cure, a portion thereof to surround the periphery of array 6 with a support structure 206A. If needed, the above process may be repeated to form support structure 206B that is contiguous with support structure 206A and additional support structures 206C-206n. It should be understood, that support structure 206 may be formed prior to or subsequent to forming cover 204. Lenses 208a-208n, IR filter 210, or both may then be fixed to support structure 206 using an adhesive or other suitable technique.

Although the foregoing description contains many specifics, these are not to be construed as limiting the scope of the present invention, but merely as providing certain exemplary embodiments. Similarly, other embodiments of the invention may be devised that do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims, are encompassed by the present invention.

What is claimed is:

1. A semiconductor device assembly comprising:
    at least one semiconductor die having lateral sides, a back side, and an active surface including a plurality of discrete conductive elements projecting therefrom; and
    a carrier substrate bearing a plurality of conductive traces in electrical communication with the plurality of discrete conductive elements;
    wherein at least a portion of the semiconductor device assembly is covered with a first cured photopolymer material, the first cured photopolymer material comprising a polymerized matrix having a plurality of discrete particles dispersed therethrough.

2. The semiconductor device assembly of claim 1, wherein the first cured photopolymer material substantially fills a volume between the at least one semiconductor die and the carrier substrate.

3. The semiconductor device assembly of claim 2, wherein the first cured photopolymer material substantially encloses the at least one semiconductor die.

4. The semiconductor device assembly of claim 3, wherein the discrete particles comprise boron nitride.

5. The semiconductor device assembly of claim 1, wherein the first cured photopolymer material covers the back side of the at least one semiconductor die and a second cured photopolymer material substantially fills a volume between the at least one semiconductor die and the carrier substrate and surrounds a lateral periphery of the at least one semiconductor die to form a contiguous structure with the first cured photopolymer material.

6. The semiconductor device assembly of claim 5, wherein the first cured photopolymer material exhibits a thermal conductivity greater than that of the second cured photopolymer material.

7. The semiconductor device assembly of claim 6, wherein the discrete particles comprise boron nitride.

8. The semiconductor device assembly of claim 1, further comprising:
    a second cured photopolymer material that substantially fills a volume between the at least one semiconductor die and the carrier substrate, the first cured photopolymer material at least partially enclosing the at least one semiconductor die and the second cured photopolymer material.

9. The semiconductor device assembly of claim 8, wherein the first cured photopolymer material exhibits an electrical conductivity greater than an electrical conductivity of the second cured photopolymer material.

10. The semiconductor device assembly of claim 9, wherein the discrete particles of the first cured photopolymer material comprise an elemental metal or an alloy.

11. The semiconductor device assembly of claim 1, wherein the first cured photopolymer material substantially fills a volume between the at least one semiconductor die and the carrier substrate, the first cured photopolymer material exhibiting a gradient in coefficient of thermal expansion that increases in a direction from the active surface of the at least one semiconductor die to a face of the carrier substrate.

12. The semiconductor device assembly of claim 11, wherein the first cured photopolymer material is comprised of more than one layer, each layer having a different concentration of the discrete particles.

13. The semiconductor device assembly of claim 11, wherein the discrete particles comprise boron nitride or a silicate material.

14. The semiconductor device assembly of claim 11, further comprising a second cured photopolymer material that covers the back side and at least a portion of the lateral sides of the at least one semiconductor die.

15. The semiconductor device assembly of claim 14, wherein the second cured photopolymer material comprises a polymerized matrix having a plurality of discrete particles dispersed therethrough.

16. The semiconductor device assembly of claim 15, wherein the discrete particles of the second cured photopolymer material comprise boron nitride.

17. The semiconductor device assembly of claim 16, further comprising a third cured photopolymer material comprising a polymerized matrix having a plurality of discrete particles dispersed therethrough, the third cured photopolymer material at least partially enclosing each of the at least one semiconductor die, the first cured photopolymer material, and the second cured photopolymer material, the third cured photopolymer material exhibiting an electrical conductivity greater than an electrical conductivity of each of the first cured photopolymer material and the second cured photopolymer material.

18. A semiconductor package comprising:
    at least one semiconductor die having an active surface including an array of optically interactive semiconductor devices defining at least one image sensor on the at least one semiconductor die; and
    a substantially opaque support structure that surrounds the array of optically interactive semiconductor devices formed from a first cured photopolymer material.

19. The semiconductor package of claim 18, further comprising a second cured, optically transparent photopolymer material that covers the array of optically interactive semiconductor devices.

20. The semiconductor package of claim 19, wherein the second cured, optically transparent photopolymer material substantially filters infrared radiation.

21. The semiconductor package of claim 19, further comprising at least one lens supported by the support structure over the array of optically interactive semiconductor devices.

22. The semiconductor package of claim 18, further comprising at least one lens supported by the support structure.

23. The semiconductor package of claim 22, further comprising an infrared filter disposed between the active surface and the at least one lens.

24. The semiconductor package of claim 18, wherein the first cured photopolymer material comprises a polymerized matrix including a plurality of discrete particles dispersed therethrough.

25. The semiconductor package of claim 24, wherein the discrete particles of the first cured photopolymer material comprise an elemental metal or an alloy.

* * * * *

UNITED STATES PATENT AND TRADEMARK OFFICE
CERTIFICATE OF CORRECTION

PATENT NO. : 7,547,978 B2  Page 1 of 1
APPLICATION NO. : 10/867257
DATED : June 16, 2009
INVENTOR(S) : David R. Hembree et al.

It is certified that error appears in the above-identified patent and that said Letters Patent is hereby corrected as shown below:

In column 14, line 63, in Claim 21, delete "claim 19," and insert -- claim 20, --, therefor.

Signed and Sealed this

Fourth Day of August, 2009

JOHN DOLL
*Acting Director of the United States Patent and Trademark Office*